US008290014B2

(12) United States Patent
Junesand et al.

(10) Patent No.: US 8,290,014 B2
(45) Date of Patent: Oct. 16, 2012

(54) ACTIVE PHOTONIC DEVICE

(76) Inventors: Carl Junesand, Stockholm (SE);
Sebastian Lourdudoss, Täby (SE)

( * ) Notice: Subject to any disclaimer, the term of this patent is extended or adjusted under 35 U.S.C. 154(b) by 185 days.

(21) Appl. No.: 12/722,275

(22) Filed: Mar. 11, 2010

(65) Prior Publication Data
US 2011/0222570 A1 Sep. 15, 2011

(51) Int. Cl.
*H01S 5/00* (2006.01)
*G02B 6/12* (2006.01)

(52) U.S. Cl. .......................... 372/50.1; 385/14
(58) Field of Classification Search .............. 372/50.1; 385/14
See application file for complete search history.

(56) References Cited

U.S. PATENT DOCUMENTS

| | | | |
|---|---|---|---|
| 4,518,219 A | 5/1985 | Leonberger et al. | |
| 4,575,919 A | 3/1986 | Logan et al. | |
| 4,622,673 A | 11/1986 | Tsang | |
| 6,965,128 B2 | 11/2005 | Holm et al. | |
| 7,257,283 B1 | 8/2007 | Liu et al. | |
| 7,639,719 B2* | 12/2009 | Fang et al. | 372/34 |
| 2005/0063440 A1 | 3/2005 | Deppe | |
| 2007/0072324 A1* | 3/2007 | Krames et al. | 438/46 |
| 2007/0170417 A1 | 7/2007 | Bowers | |
| 2008/0002929 A1* | 1/2008 | Bowers et al. | 385/15 |
| 2009/0116523 A1* | 5/2009 | Leem et al. | 372/44.01 |
| 2009/0245298 A1 | 10/2009 | Sysak et al. | |
| 2011/0158278 A1* | 6/2011 | Koch | 372/45.012 |

FOREIGN PATENT DOCUMENTS

| | | |
|---|---|---|
| EP | 0390061 | 10/1990 |
| WO | WO 2008/115135 | 9/2008 |

OTHER PUBLICATIONS

Nishinaga T et al: "Epitaxial Lateral Overgrowth od GaAs by LPE", Japanese Journal of Applied Physics, vol. 27, No. 6, Jun. 1988, pp. L964-L967.
R.P. Gale et al: Lateral Epitaxial Overgrowth of GaAs by Organometallic Chemical Vapor Deposition, Lincoln Laboratory, pp. 545-547.
Sakai S and Ohashi Y:"Selective Lateral Growth Mechanism of GaAs by Liquid-Phase Electroepitaxy" Jpn. J. Appl. Phys. vol. 33 (1994) pp. 23-27.

* cited by examiner

*Primary Examiner* — Jessica Stultz
*Assistant Examiner* — Phillip Nguyen
(74) *Attorney, Agent, or Firm* — Birch, Stewart, Kolasch & Birch, LLP

(57) ABSTRACT

An active photonic device assembly comprising a substrate and a waveguide entity provided on the substrate. The active photonic device assembly further comprises a contact layer of a first III/V material epitaxially grown laterally on top of the waveguide entity from opening fillings in turn provided on a substrate surface. An active photonic device is provided on the contact layer.

20 Claims, 11 Drawing Sheets

ACTIVE PHOTONIC DEVICE

TECHNICAL FIELD

The present invention relates in general to active photonic device and their manufacturing.

BACKGROUND

Silicon, while being an excellent material in many respects of importance for the microelectronics industry as well as for the fabrication of passive optical devices, suffers from one major drawback; the inability to sustain efficient stimulated light emission by electrical pumping. In effect, this means that a laser that can be made to lase by introducing current through it made purely out of silicon is not feasible today. Since lasers are the fundamental light sources for all optical data transfer systems, this is a severe shortcoming. Up to now, no fully satisfactory solution to this problem has been presented.

Compound semiconductors, such as e.g. III-V semiconductors having direct bandgap, can however be utilized for achieving stimulated light emission. Despite their superior electronic properties with respect to silicon, cost aspects have favored silicon for microelectronics. Attempts to combine compound semiconductor laser components with silicon or $SiO_2$ substrates or waveguides have been performed. The closest such attempt is based on what is called bonding technology in which a layer of a compound semiconductor is transferred either to a silicon substrate, or directly to a $Si/SiO_2$ waveguide. Different variations on this approach exist, such as bonding an entire compound semiconductor substrate to a silicon substrate, bonding a pre-fabricated compound semiconductor photonic device die to a silicon substrate or bonding a stack of compound semiconductor material, on which an active photonic device can be subsequently fabricated, to a silicon substrate. Of these approaches, the latter seems to be the most promising, for the reason that it allows flexibility in alignment and enjoying advantages of economics to scale since dies can be bonded to a substrate of any size, unlike a substrate which must match the size of the host substrate for scale economics to be advantageous.

In the published US patent applications 2007/0170417 A1 and 2009/0245298 A1, photonic integrated circuits on silicon are disclosed. By bonding a wafer of III-V material as an active region to silicon and removing the substrate, the lasers, amplifiers, modulators and other devices can be processed using standard photolithographic techniques on the silicon substrate.

Indeed, active photonics devices have been successfully fabricated based on these approaches, such as light sources, detectors and modulators. However, some problems still persist. The first is related to both approaches where dies (normally bonded by adhesive bonding in which a polymer is used as adhesive) and where substrates (normally achieved by direct bonding in which two substrates have a common $SiO_2$ interface without an adhesive) are bonded. Since the vast majority of the several hundred μm-thick compound semiconductor substrate goes to waste. This is undesirable since compound semiconductor substrates, such as InP or GaAs which are the most widely used for fabrication of lasers emitting at telecom wavelengths, are expensive. In addition, they are only available in sizes much smaller than that of silicon. This means that fabrication of active devices cannot benefit from advantages associated with economics of scale by moving to larger substrates as demand increases. An additional drawback in the case of adhesive bonding pertains to the properties of the bonding medium; so far, the most promising results have been obtained with the polymer known as Benzocyclobutene (BCB). Whereas this material possesses desirable properties in terms of low optical loss, good adhesion at low temperatures and the ability to planarize surfaces, it has poor thermal conductivity. Since heat dissipation is a major issue in active devices such as lasers, this is a serious drawback that must be remedied by subsequent formations of thermal vias through which the heat can escape. This is not as big an issue in the case of direct bonding, although $SiO_2$ also has relatively poor heat conduction. An additional problem with direct bonding is however void formation at the $SiO_2$ interface.

Finally, there are some issues with the bonding step itself in terms of yield and efficacy; firstly, there exists as of yet no process for bonding dies to a wafer in a production volume-friendly way, and secondly, although alignment is not critical if the bonded dies do not contain pre-fabricated lasers, the accuracy in alignment that is practically achievable puts a limit on the density of useful devices that can be achieved.

In the published US patent application 2007/0170417 A1, an electrically pumped semiconductor evanescent laser is disclosed. An optical waveguide is disposed in silicon. An active semiconductor material is disposed over the optical waveguide defining en evanescent coupling interface between the optical waveguide and the active semiconductor material.

To our knowledge prior art attempts to grow active semiconductor material directly on a $Si/SiO_2$ waveguide have not been undertaken, although growth of active semiconductor material on silicon has been tried extensively. The probable reason is that in epitaxial growth of a compound semiconductor directly on silicon, defects will result. Among these defects are so-called threading dislocations, spontaneously forming to release the strain that arises since compound semiconductors such as GaAs and InP have lattice constants as well as coefficients of thermal expansion that differ from that of silicon. These defects degrade device performance, in particular by radically decreasing device lifetime.

SUMMARY

A general objective of the present invention is to provide active photonic devices that are easy to manufacture with a high quality and low cost. This objective is achieved by devices and their manufacturing methods according to the enclosed independent patent claims. Preferred embodiments are defined by the independent claims. In general words, in a first aspect, an active photonic device assembly comprises a substrate. The substrate is a semiconductor substrate or an insulator substrate. The substrate has a substrate surface. The active photonic device assembly further comprises a waveguide entity provided on the substrate surface. The active photonic device assembly further comprises an opening filling, and a contact layer comprising a first semiconductor material. The opening filling comprises the first semiconductor material provided on the substrate surface. The waveguide entity and at least a part of the opening filling are arranged adjacent to each other in a direction parallel to the substrate surface. The contact layer comprises the first semiconductor material epitaxially grown from the opening filling in a direction parallel to the substrate surface on top of a surface of the waveguide entity facing away from said substrate surface. An active photonic device is provided on the contact layer.

In a second aspect, a method for manufacturing of an active photonic device assembly comprises obtaining of a substrate, being a semiconductor substrate or an insulator substrate. The substrate has a substrate surface. A waveguide entity is provided on the substrate surface. An opening filling is provided on the substrate surface. The provision of a waveguide entity and the provision of an opening filling together arrange the waveguide entity and at least a part of the opening filling adjacent to each other in a direction parallel to the substrate surface. A contact layer of a first semiconductor material is grown epitaxially from the opening filling in a direction parallel to said substrate surface on top of a surface of the waveguide entity facing away from the substrate surface. An active photonic device is provided on the contact layer.

One advantage with the present invention is that active photonic devices can be manufactured without having to rely on bonding processes, even on silicon substrates. Since active devices are grown with high quality directly on the substrate containing passive waveguides, there is no need for using separate compound semiconductor substrates, and there is no constraint in substrate size. Secondly, since the contact layer onto which the active device is fabricated is in contact with silicon through semiconductor material with good thermal conductivity, thermal dissipation is effectively achieved through this material. Filially, since growth is selective, devices can be integrated with much higher density limited only by lithography which has an accuracy several orders of magnitude higher than the alignment in bonding, and which is continuously improving as new techniques become available such as nanoimprint lithography and e-beam lithography. The precision in alignment can thereby be increased at the same time as the number of different kinds of process steps during manufacturing can be reduced. Further advantages are described in connection with the different embodiments in the detailed description.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
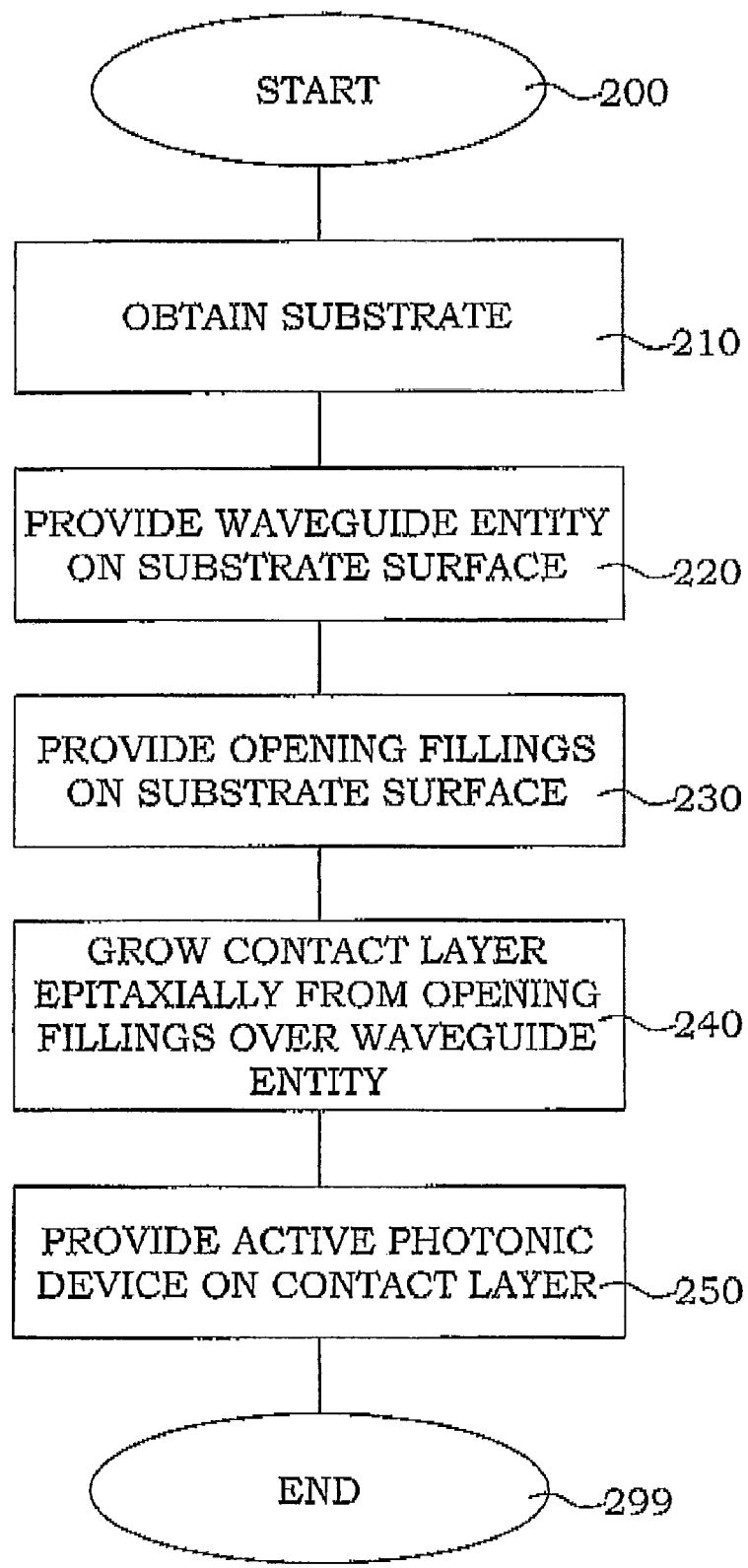
FIG. 1 is a flow diagram of steps of an embodiment of a manufacturing method according to the present invention.

Throughout the drawings, the same reference numbers are used for similar or corresponding elements.

The proposed method relies on monolithic integration of active devices on silicon by epitaxy and solves most problems of prior art approaches. Integrating an active photonic device with $Si/SiO_2$-based waveguides in an effective way has been a long-standing goal since it would allow truly photonic circuits to be based on a silicon platform with all its inherent advantages. By growing e.g. a thin high-quality layer epitaxially on top of a $Si/SiO_2$ waveguide, active photonic devices can be integrated monolithically, allowing a high integration density of devices all fabricated on the same substrate without the need for other semiconductor substrates, e.g. III-V substrates, and intermediate process steps such as bonding that adds complexity and may increase fabrication cost.

Heterogeneous integration of compound semiconductors with silicon by epitaxy as such, though possessing several advantages, also presents some issues. Most notably, as briefly noted above, the epitaxy of a compound semiconductor directly on silicon will result in defects, notably so-called threading dislocations, spontaneously forming to release the strain that arises since compound semiconductors such as GaAs and InP have lattice constants and coefficients of thermal expansion that differ from that of silicon. Threading dislocations act as non-radiative recombination centers which degrade e.g. laser performance, notably by dramatically decreasing lifetime.

A method for coming to terms with this is the concept referred to as epitaxial lateral overgrowth, (ELOG). Such an approach can e.g. be found in the published international patent application WO 2008/115135 A1. The basic principle of ELOG is to cover the defect-rich compound semiconductor layer on top of the silicon with a mask, etch openings in the mask and grow selectively in these openings. As the grown layer reaches the height of the mask, it expands laterally, and threading dislocations, though capable of extending as vertical growth takes place, are blocked by the mask during the lateral growth, thus resulting in a defect-free layer on top of the mask. In this way, drastic reduction of threading dislocation density has been achieved. However, the grown layer becomes several thick, which is why integrating any device made on this with any device on the silicon substrate cannot be done in a straight-forward manner. Besides, in order be effective, the openings have to be arranged in a certain regular pattern. Covering a substrate with a mask patterned in a certain fashion puts obvious limitations on the design and type of devices that can be fabricated; in particular, waveguides on the silicon substrate extending across the substrate will disrupt the pattern of the mask compromising the quality of the overgrown layer, and the coupling of these waveguides to active material remains problematic due to the spatial separation of active layer from the waveguides. Even if silicon-based waveguides can be fabricated on top of the overgrown ELOG layer, the problem with coupling the light from the active material to these waveguides remains, and it is advantageous to have silicon-based passive components directly on the silicon substrate. Finally, since most of the silicon substrate will be covered by a mask comprising an insulator such as $SiO_2$ except for the narrow openings, etched in said mask, which are required to achieve effective dislocation filtering, thermal conductivity between the overgrown layer and silicon substrate will be poor. This is a serious drawback since heat dissipation is of prime importance for photonic devices such as lasers. Thus, while this approach does solve the problem with obtaining large substrates with III-V material at a reasonable cost, it still does not resolve the issues with integrating optically active material with silicon-based passive optical components such as waveguides.

The proposed method according to the present invention further develops the advantages of the ELOG concept. The overgrowth of an active device-bearing layer on passive waveguides is taking place from a defect-rich compound semiconductor seed layer. The $SiO_2$ cladding or cladding of any other suitable material will in itself be utilized as a "mask" and block dislocations. No additional masking will be necessary to provide the high-quality overgrowth. The layer above the silicon waveguide core will therefore be of good quality, thus allowing the fabrication of lasers and other active photonic devices. Recent results on which the present invention is based suggest that growing very thin layers of semiconductor material of good quality on top of several densely spaced waveguides indeed is possible, thus proving the usefulness of the concept.

FIG. 1 illustrates a flow diagram of steps of an embodiment of a method according to the present invention. The method for manufacturing of an active photonic device assembly starts in step 200. In step 210, a substrate is obtained. The substrate has a substrate surface defined by a substrate surface normal. A waveguide entity is provided on the substrate surface in step 220. The waveguide entity typically comprises a waveguide core, typically of silicon, and a cladding, typically silicon oxide, surrounding the waveguide core. In step 230, an opening filling of a first semiconductor material is provided on the substrate surface, deposited to give the opening filling a dimension in a direction transverse to the substrate surface. In the present disclosure, this growth direction transverse to the substrate surface, i.e. a direction essentially parallel to the substrate surface normal, is also denoted as "vertically", with reference to the substrate surface. Step 220 and 230 are performed such that the waveguide entity and at least a part of the opening filling become arranged adjacent to each other in a direction parallel to the substrate surface. This direction is also in the present disclosure referred to as "laterally" in reference to the substrate surface, i.e. defining a direction perpendicular to the substrate surface normal. In step 240, a contact layer of the first semiconductor material is grown epitaxially from the opening filling in a direction parallel to said substrate surface on top of a surface of the waveguide entity facing away from the substrate surface. The covered surface of the waveguide entity is thus the one being directed in the same direction as the substrate surface. In other words, the contact layer is provided by an epitaxial lateral growth covering the waveguide entity. Steps 230 and 240 can advantageously be performed as one common procedure. The contact layer is typically of n-type if an n-type contact is intended to be provided on the contact layer, and of p-type if a p-type contact is intended to be provided on the contact layer. The epitaxial growth can be achieved for example by hydride vapour phase epitaxy (HVPE), but other growth techniques such as molecular beam epitaxy (MBE), metal organic vapour phase epitaxy (MOVPE) and liquid phase epitaxy (LPE) can also be used. An active photonic device is provided on the contact layer in step 250. The method is ended in step 299. As seen in further embodiments below, the order of the steps may be altered.

Figure 2A:
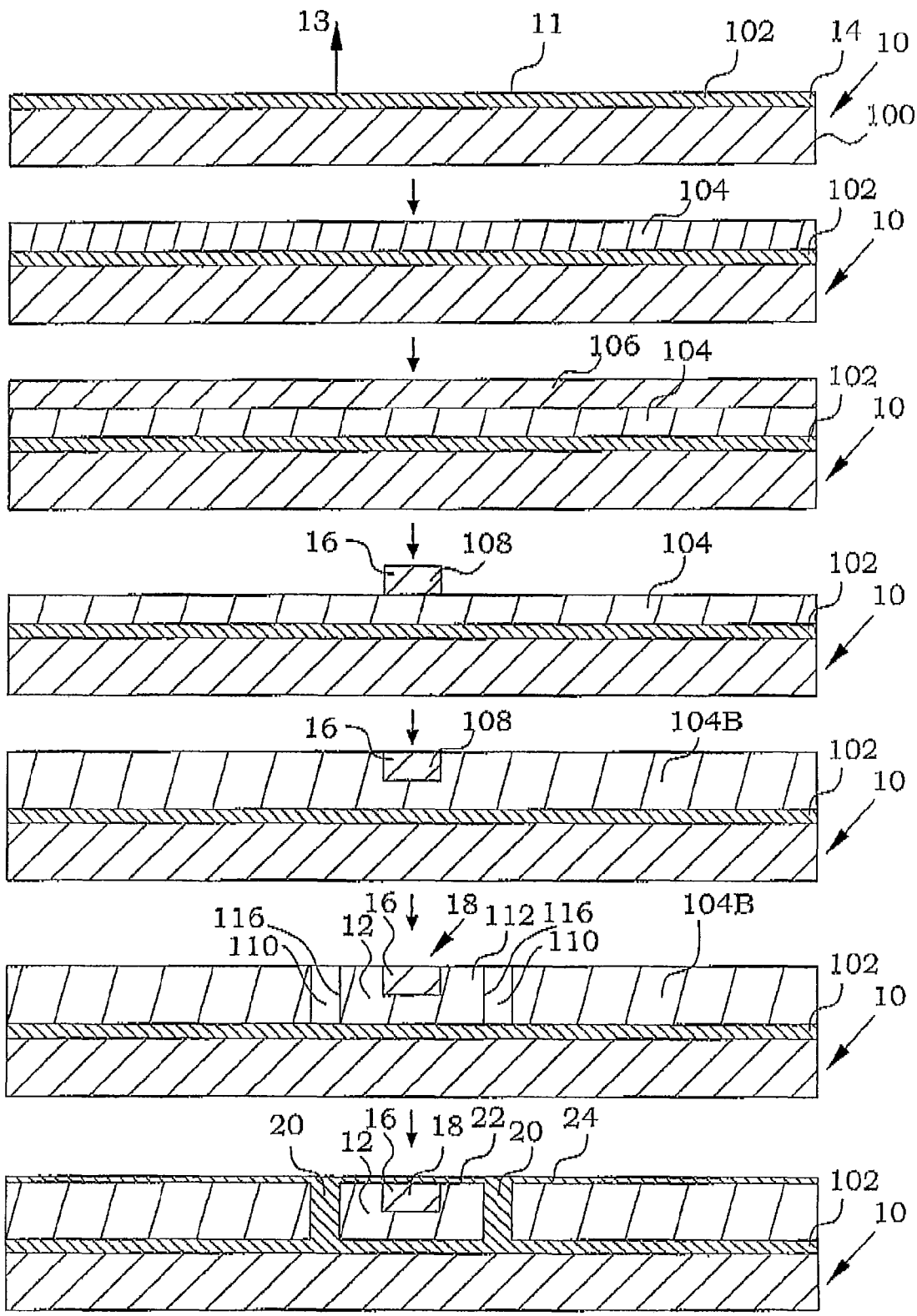
FIG. 2A is a schematic illustration of a specific embodiment of a manufacturing method according to the present invention.

In another, more specific embodiment of the present invention, illustrated schematically in FIG. 2A, a volume of silicon 100 is provided as a main volume of a substrate 10. On top of the silicon 100 a seed layer 14 is provided, in this embodiment an InP seed layer 102. This InP seed layer 102 is typically of relatively low quality, having relatively large defect content as discussed above, and will be further utilized later in the process. A surface of the seed layer is lattice matched to the material that is intended to be grown on top of the seed layer. The seed layer can alternatively comprise other materials, e.g. GaAs, or other materials in combination with the material that is intended to be grown on top of the seed layer, in this embodiment InP. The seed layer may also present a composition gradient over the thickness of the layer. In this embodiment, the silicon 100 and the InP seed layer 102 together constitute a substrate 10. The substrate 10 in this embodiment thus has a substrate surface 11 of an InP seed layer 102, defined by a substrate surface normal 13. A lower waveguide cladding layer 104, in this embodiment $SiO_2$, is deposited, in the present embodiment by spin coating, which has a planarizing effect beneficial in this case, onto the InP seed layer 102, i.e. on to the substrate surface 11. A wave guide core layer 106, in the present embodiment silicon, is deposited onto the lower waveguide cladding layer 104 and subsequently etched to leave a waveguide core 16, in this embodiment a strip Si waveguide core 108, from the wave guide core layer 106. Such processes are performed according to standard semiconductor techniques, known as such in prior art, and are not described more in detail. $SiO_2$ is again deposited, in the present embodiment spin-coated, onto the original lower waveguide cladding layer 104 beside the strip Si waveguide core 108, building up a thicker waveguide cladding layer 104B. This cladding may also extend above the height of the waveguide core and cover it without changing subsequent process steps. Openings 110 are etched through the waveguide cladding layer 104B down to the InP seed layer 102. The waveguide core 16 and cladding 12, the latter in the present embodiment constituted by the remaining $SiO_2$ volumes 112 surrounding the waveguide core 16, together compose a waveguide entity 18. In this particular embodiment, the InP seed layer 102 was provided over the entire surface of the silicon 100, and is thus deposited below the waveguide entity 18 as well as laterally adjacent to both sides 116 of the waveguide entity 18. "Laterally" is here used to describe a direction along the substrate surface. Such laterally adjacent parts of the InP seed layer 102 are now exposed through the openings 110. Finally, a semiconductor material, in this embodiment InP, is epitaxially grown to fill up the openings 110 as opening fillings 20 and to epitaxially grow laterally on top of the waveguide entity 18 as a contact layer 22. In a general case, the material in the opening fillings should be lattice matched to the material in the contact layer, and preferably the opening filling material and the contact layer material is the same, at least in the interface therebetween. The opening fillings 20 and the contact layer 22 together forms a coupling volume 24. The contact layer 22 has a good quality with a low defect density, which is due to the fact that the epitaxy emanates from the opening fillings 20 grown at the sides of the waveguide entity 18, where the dislocations successively are blocked. On top of the contact layer 22, an active photonic device can easily be provided, e.g. as a III-V laser stack with attached contacting. If the contact layer 22 is made thin enough an evanescent coupling between the active photonic device and the waveguide core 16 can be obtained.

Naturally, the substrate may be of the same material as the contact layer, in the above embodiment InP, which eliminates the need for depositing a seed layer. This also applies to the following embodiments.

Figure 2B:
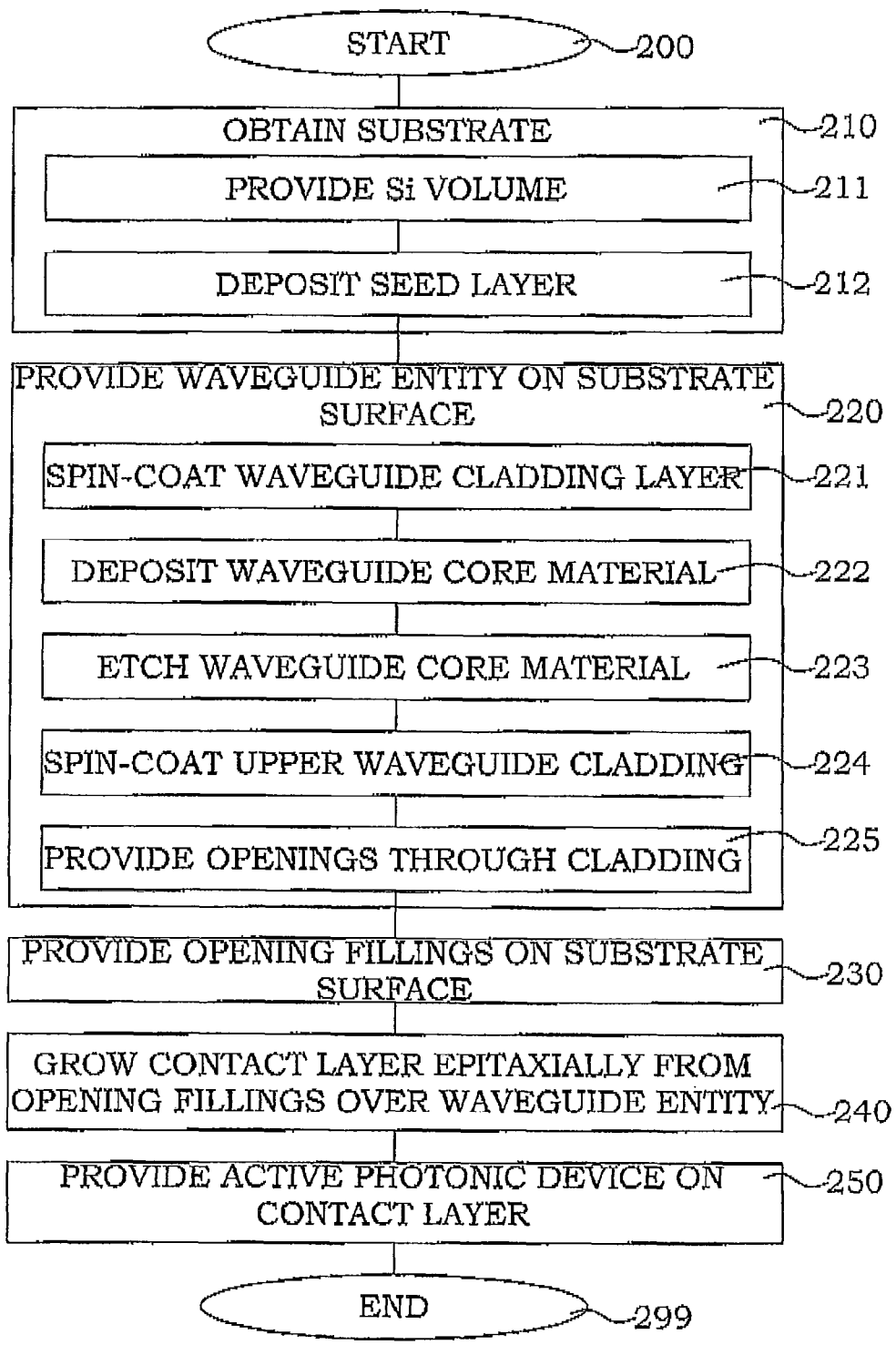
FIG. 2B is a flow diagram of steps of the embodiment of a manufacturing method comprising the procedure according to FIG. 2A.

A corresponding flow diagram is illustrated in FIG. 2B together with steps of providing an active photonic device. The step 210 here comprises two part steps. In step 211, a main Si volume is provided and in step 212, a seed layer of a first compound semiconductor material, in this embodiment InP, is deposited, to provide a substrate. Step 220 comprises the part steps 221-225. In step 221, a waveguide cladding layer, in this embodiment $SiO_2$, is spin-coated, in step 222, waveguide core material, in this embodiment Si, is deposited on top of the waveguide cladding layer, in step 223, the waveguide core material is etched leaving the waveguide core, which can be of e.g. a strip or ridge type, in step 224, an additional cladding layer constituting upper waveguide cladding is spin-coated covering the waveguide and in step 225, openings are provided, forming the final waveguide entity. The step of providing a waveguide entity is thus performed by providing material for the waveguide entity on the substrate, for example by chemical vapour deposition (CVD) techniques. Steps 230 and 240 are basically performed as described before. Step 250 comprises in this embodiment several part steps. A number of active layer, typically comprising a superlattice layer, an electrical contact layer and multiple quantum wells (MQW) layer as well as separated confinement heterostructure (SCH) layers, are grown on top of the contact layer. Alternatively, the contact layer may be used for electrical contacting of the photonic device, which eliminates the need for growing this in step 250. A top contact layer of the photonic device is deposited with a doping corresponding to the type of contact and finally, metallization is performed for creating ohmic contacts on the active photonic device. In case the photonic device is a laser, cavity mirrors may be formed by etching or cleaving facets, or they may be formed by gratings that may be part of the silicon waveguide.

Figure 2C:
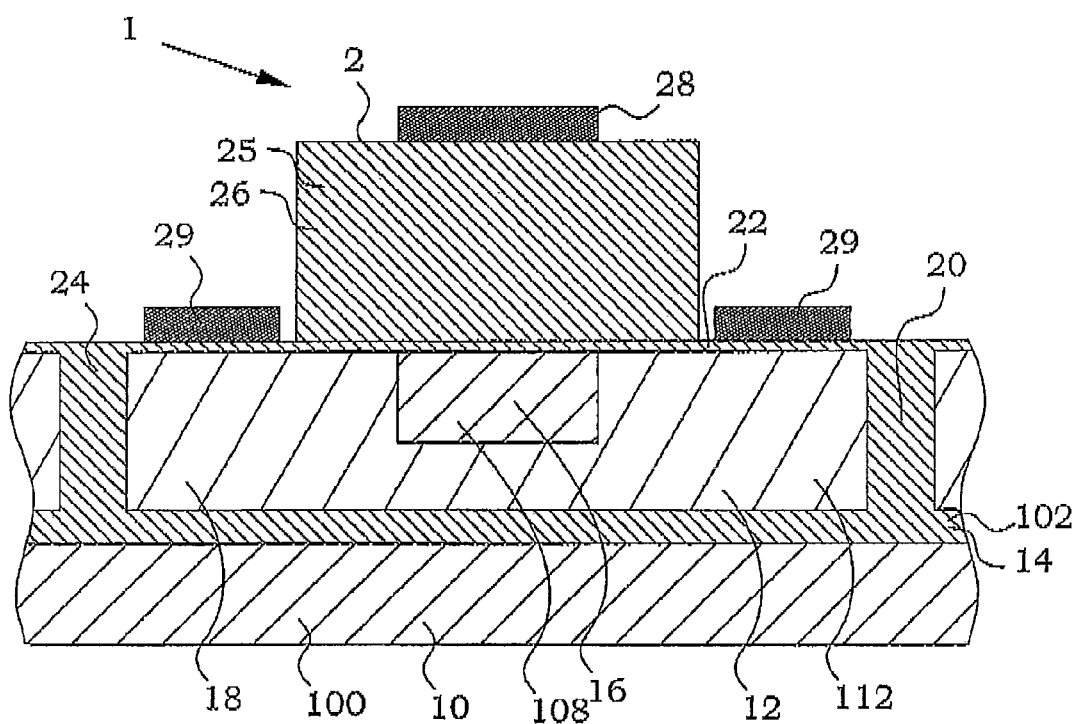
FIG. 2C is a schematic illustration of an embodiment of an active photonic device assembly possible to achieve by the embodiment of a manufacturing method according to FIG. 2A.

FIG. 2C illustrates schematically an active photonic device assembly 1, in this embodiment a Fabry-Perot (FP) laser 2. The active photonic device assembly 1 comprises a substrate 10, in this embodiment a silicon 100 volume with a seed layer 14, in this embodiment the InP seed layer 102, provided on top. The substrate 10 of the FP laser 2 according to the present invention can be based on either silicon or silicon on insulator (SOI). The difference is mainly how the waveguides are defined and how the seed layer 14 is deposited. In the present embodiment, a waveguide entity 18 comprising silicon is provided on the substrate 10. The waveguide entity 18, in this embodiment a strip waveguide, comprises a waveguide core 16 and a cladding 12, in this embodiment the silicon oxide volume 112. The InP seed layer 102 is thereby provided below the waveguide entity 18 as well as laterally adjacent to the sides of the waveguide entity 18. The InP, in this embodiment of n-type, is epitaxially grown from the seed layer 14 via the opening fillings 20 and laterally on top of the waveguide entity 18 as a contact layer 22 under such conditions that lateral growth is favored, so that a thin layer covering the waveguide(s) is achieved.

In this embodiment, regardless of which starting substrate is used, waveguides have to be defined and a seed layer has to be deposited, either as a part of the substrate itself or as a first part of the opening fillings 20. The process steps for achieving the thin layer on top of the waveguide for growing an active layer are similar. The thickness of the seed layer 14 will be lower than that of the waveguide entities 18.

Besides the above described features, the waveguides may be provided by mirrors gratings etc. assisting in the operation of the active photonic device, as is known in prior art.

Growth of the active photonic device structure is performed according to well-established standard processes. An active photonic device 25 is provided on the contact layer 22. In this embodiment, the active photonic device 25 is a Fabry-Perot laser 2, i.e. a laser emitter. After the growth of the active photonic device, etching will in this embodiment be performed so that the active photonic device structure resides on top of the actual waveguide as well as etching of the waveguide to form facet mirrors. The active photonic device 25 comprises in this embodiment a III-V laser stack 26, a p-type upper cladding, p-contact metal coatings 28 and n-contact metal coatings 29. In the present embodiment, the p-contact metal coating 28 is provided on top of the p-type cladding of the III-V laser stack 26 and the n-contact metal coatings 29 are provided on the n-type contact layer 22 on the sides of the active photonic device structure. In an alternative embodiment, an n-contact metal coating 29 may instead be provided on the opposite side of the active photonic device assembly 1 in contact with the substrate 10, which requires that said substrate is n-type. N- and p-type contacts may be inversely placed, in which case the doping of the coupling layer and III-V stack cladding also is inversed.

Epitaxial lateral overgrowth (ELOG) by hydride vapour phase epitaxy (HVPE) has as such been achieved previously, notably in the case of growth of GaN. However, certain properties of HVPE that are advantageous in the case mentioned provide difficulties in the current case, which is one of the reasons why the proposed strategy has never been conceived before. To begin with, the growth rate in an HVPE system is rather high, which is certainly advantageous in a lot of cases where thick layers are desired, but less so when the goal is a very thin layer. Related to this issue, in order to cover an entire waveguide with a thin layer, the aspect ratio, that is, the ratio of the lateral growth rate to the vertical growth rate needs to be large. Moreover, there are some issues with achieving good morphology of the surface of the overgrown structure and finally, when growth fronts merge laterally on top of the structure, coalescent defects such as threading dislocations and stacking faults may be created.

However, by varying the angle with respect to the crystallographic direction of the waveguides, the width and separation distances of these as well as growth conditions and growth time it has been shown that such potential problems may indeed be mitigated. In the experiment, a ~370 nm thick $SiO_2$ mask was deposited on an InP substrate, and openings were etched in the mask to simulate waveguides with different widths and separations. Growth was then performed in an Aixtron commercial HVPE reactor according to the experimental parameters presented below in Table 1 and Table 2.

TABLE 1

$SiO_2$ mask parameters.

| Type | No. | Opening angle off [110] | Opening width [nm] | Opening separation [nm] |
|---|---|---|---|---|
| A | 1 | 30° | 200 | 100, 300, 500, 1000 |
|   | 2 | 30° | 400 |  |
|   | 3 | 60° | 200 |  |
|   | 4 | 60° | 400 |  |
| B | 5 | 30° | 100, 300, 500, 1000 | 100 |
|   | 6 | 30° |  | 300 |
|   | 7 | 30° |  | 500 |
|   | 8 | 60° |  | 100 |

TABLE 1-continued

SiO₂ mask parameters.

| Type | No. | Opening angle off [110] | Opening width [nm] | Opening separation [nm] |
|------|-----|-------------------------|--------------------|--------------------------|
|      | 9   | 60°                     |                    | 300                      |
|      | 10  | 60°                     |                    | 500                      |

TABLE 2

Process parameters.

| Growth temperature [° C.] | PH₃ flow [sccm] | InCl flow [sccm] | V/III ratio | Growth time [mm:ss] |
|---------------------------|-----------------|------------------|-------------|----------------------|
| 610                       | 120             | 24               | 5           | 1:00                 |
| 610                       | 120             | 12               | 10          | 1:30                 |
| 610                       | 120             | 8                | 15          | 2:15                 |

The results from the experiments showed that it is indeed possible to reach a high and controllable aspect ratio as well as controllable growth rates in this manner. Aspect ratios of up to 5.5 could be achieved as well as growth thicknesses down to less than 210 nm. Even thinner thicknesses can be achieved by further reducing the lateral growth width. By modifying the growth conditions such as temperature and V/III ratio, the aspect ratio of the growth could be further altered, opening up for even thinner growth thicknesses. The contact layer in an active photonic device assembly according to the present invention is preferably thinner than 1000 nm, more preferably thinner than 500 nm, even more preferably thinner than 300 nm and most preferably thinner than 200 nm. It can therefore be concluded that extremely thin epitaxial overgrowths of compound semiconductor materials of good quality on top of waveguides can be achieved by utilizing the waveguides themselves as dislocation blocking structures. In order for the blocking of threading dislocations to be complete, the separation between waveguide entities should be equal to or less than the height of the waveguide entity, since threading dislocations in III-V compound semiconductors like InP tend to propagate at an angle of 45° with respect to the substrate surface.

Besides the above presented experiments, tests with different directions have been performed. It was found that the quality and the growth aspect ratio under many conditions were favored if the blocking structure, i.e. in the present invention the waveguide entity, is at least partly aligned at a nonzero angle with respect to both main crystal axes of the substrate surface. In the present invention, the main crystal axes are the main crystal axes of the main volume of the substrate in a plane parallel to the substrate surface. Angles of 30° and 60° with respect to any of the main crystal axes were tested to be favorable and in most cases, and previous studies have established that the benefits were most pronounced at an angle larger than 5° and smaller than 85° with respect to any of said main crystal axes.

The resulting III-V layer on top of the waveguide can be used as a platform for a variety of devices, for example Fabry-Perot lasers, single mode lasers such as Distributed Feedback (DFB) and Distributed Bragg Reflector (DBR) lasers, microring lasers, photodetectors etc. The overgrown layers in previously mentioned experiments were characterized with atomic force microscopy (AFM) and cathodoluminescence (CL), which confirmed that an overgrown layer could be achieved with uniform morphology and a smooth top surface without introducing defects that degrade optical quality which is important for active photonic devices. The contact layer may also be polished by chemical mechanical polishing (CMP) techniques, well described in prior art, to further reduce thickness and increase smoothness. For example, a Fabry-Perot laser could be fabricated on top of this layer as described previously. Such thin contact layers as presented above opens up for using evanescent coupling between any active device grown on top of the contact layer and the wave guide below the contact layer.

Figure 3A:
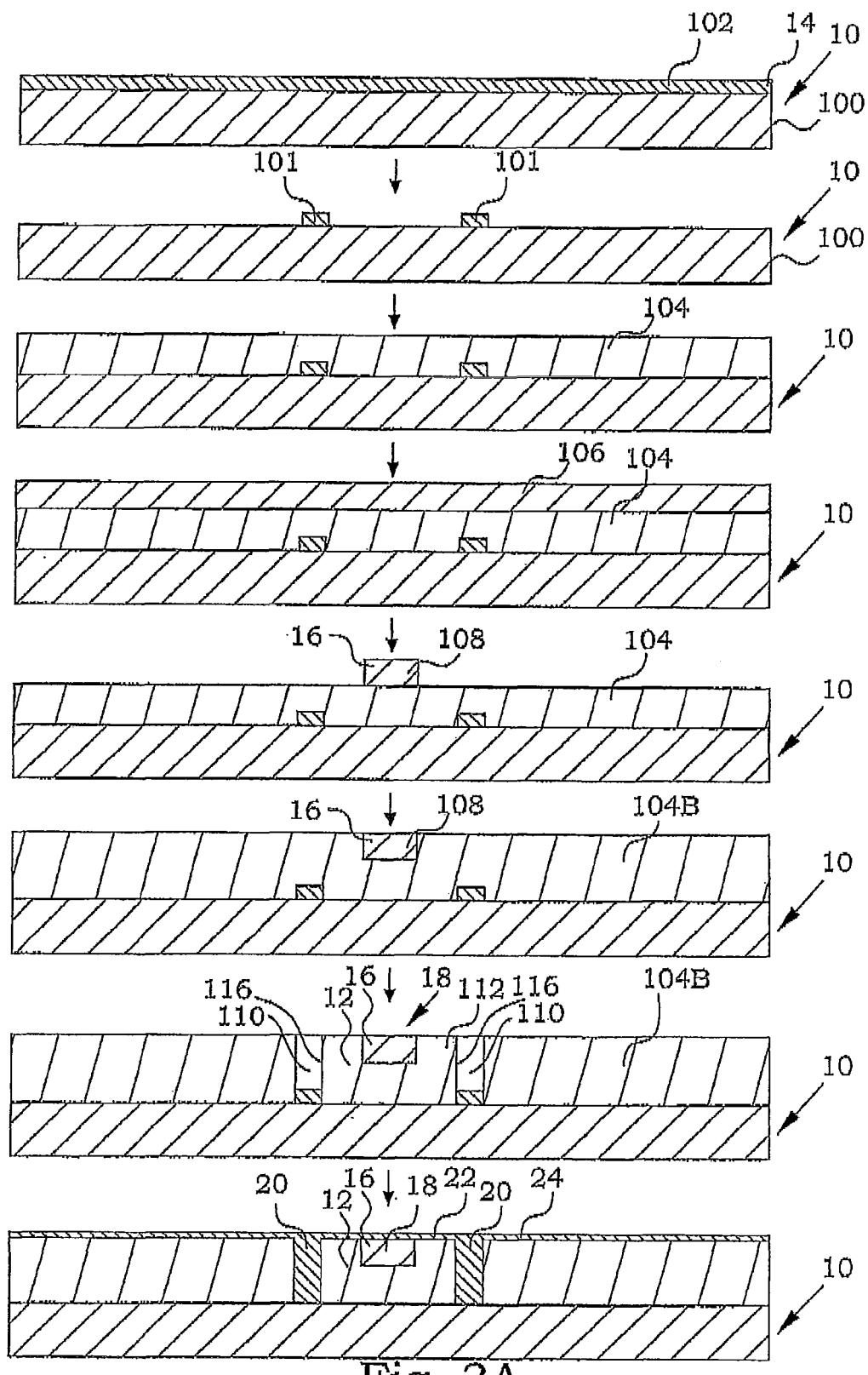
FIG. 3A is a schematic illustration of another specific embodiment of a manufacturing method according to the present invention.

In FIG. 3A, another embodiment of the present invention is illustrated schematically. Parts that are similar to the ones on FIG. 2A are not discussed in detail. Instead, the description of FIG. 3A will focus on the differences. In this embodiment, an InP seed layer 102 is provided at the substrate 100. A surface of the seed layer is lattice matched to the material used for providing the opening fillings, in the present embodiment InP. As mentioned earlier, the seed layer can alternatively comprise other materials, e.g. GaAs. The seed layer may also present a composition gradient over the thickness of the layer. The seed layer 102 is subsequently etched to save only stripes 101 of the InP seed layer 102. The waveguide entity is then provided in a similar manner as before, except for that the openings 110 through the cladding layer are etched down to the stripes 101 instead of to the substrate 100. This results in that, in this particular embodiment, the InP seed layer 102 is provided laterally adjacent to both sides 116 of the waveguide entity 18, but not below the waveguide entity 18. The growth of the opening fillings 20 and contact layer 22 follow earlier described operations.

Figure 3B:
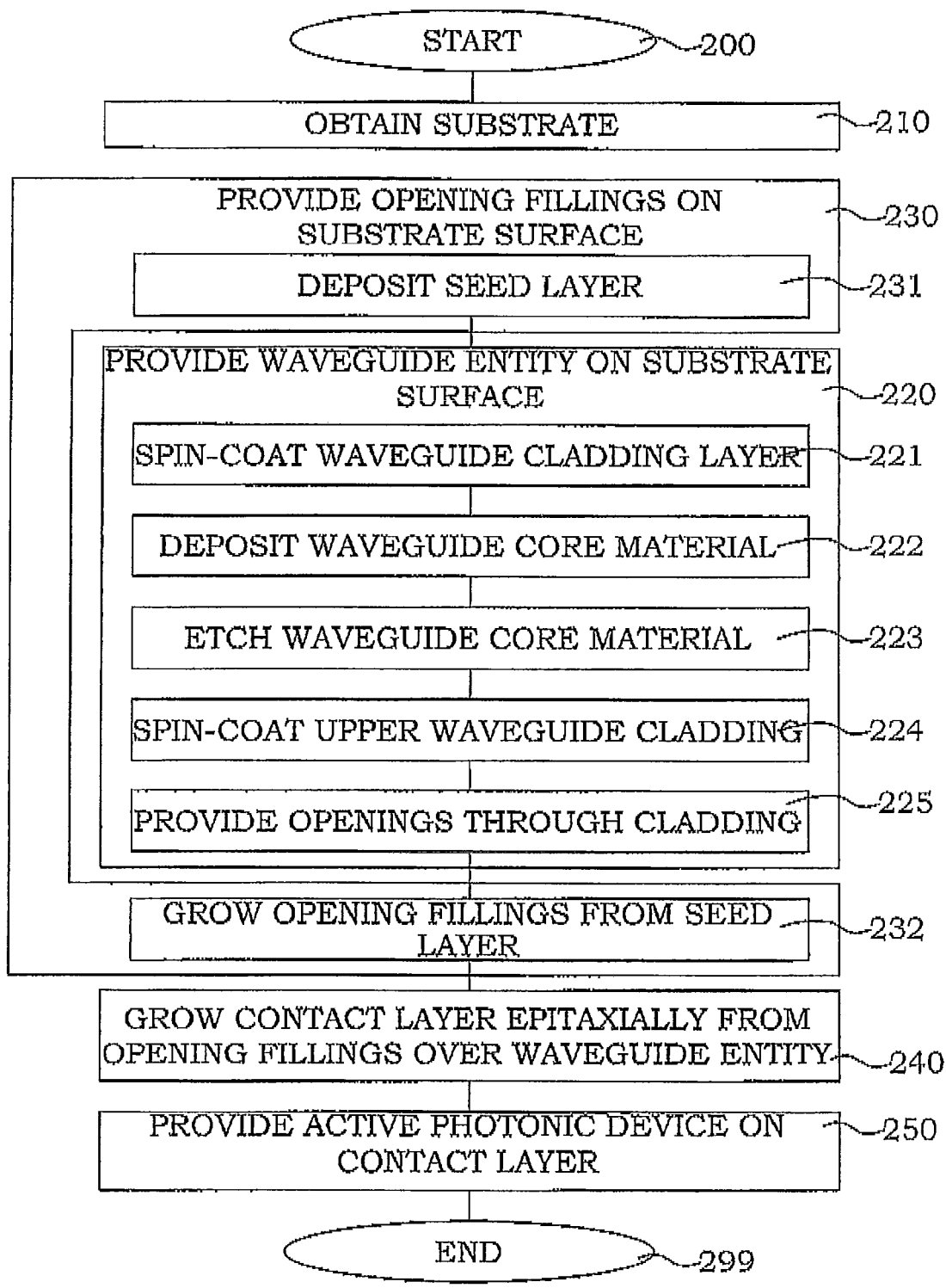
FIG. 3B is a flow diagram of steps of the embodiment of a manufacturing method according to FIG. 3A.

In FIG. 3B, a corresponding flow diagram is illustrated. Most steps are similar to those in FIG. 2B and will not be further discussed. The step 210 here comprises the simple step of providing a substrate. Step 230 comprises in this embodiment two part steps. Step 231 comprises the provision of the multiple stripes of seed layer. This step occurs before step 220. Step 232 comprises the act of growing the opening filling from the stripes of seed layer. This typically occurs after step 220.

Figure 4:
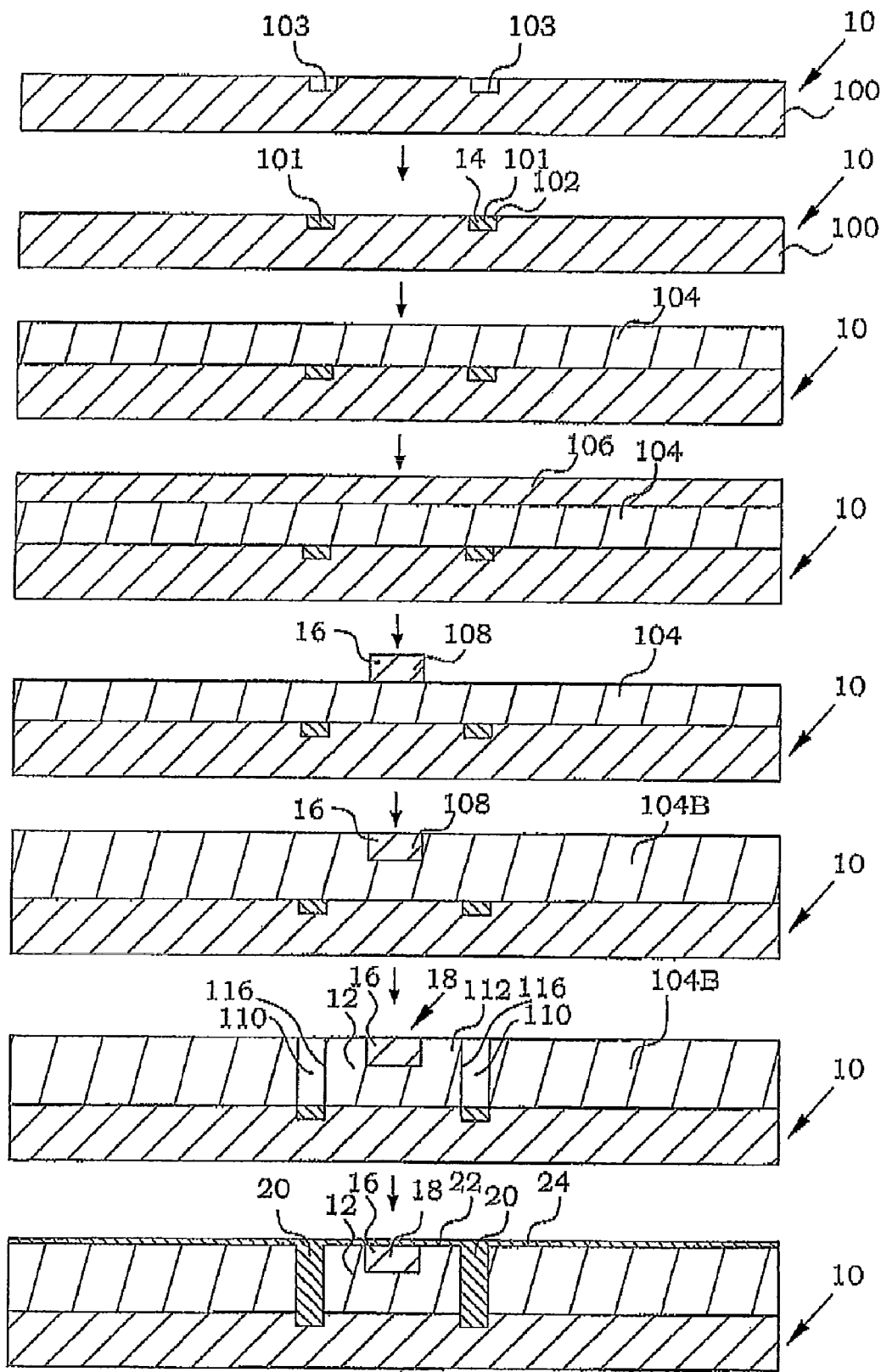
FIG. 4 is a schematic illustration of yet another specific embodiment of a manufacturing method according to the present invention.

In FIG. 4, yet another embodiment of the present invention is illustrated schematically. Parts that are similar to the ones on FIG. 2A and FIG. 3A are not discussed in detail. Instead, the description of FIG. 4 will focus on the differences. In this embodiment, the substrate is etched to present grooves 103. An InP seed layer 102 is subsequently provided in these grooves 103 at the substrate 100, forming stripes 101 of the InP seed layer 102. The waveguide entity is then provided in a similar manner as before, and the openings 110 through the waveguide cladding layer are etched down to the stripes 101, which in this embodiment is in the same level as the substrate 100. This results in that, in this particular embodiment, the InP seed layer 102 is provided laterally adjacent to both sides 116 of the waveguide entity 18 and somewhat below the bottom of the waveguide entity 18. The growth of the opening fillings 20 and contact layer 22 follow earlier described operations.

The flow diagrams of FIG. 2B or 3B can be used to illustrate this procedure, depending on whether one considers the seed layer to be a part of the substrate or not.

Figure 5A:
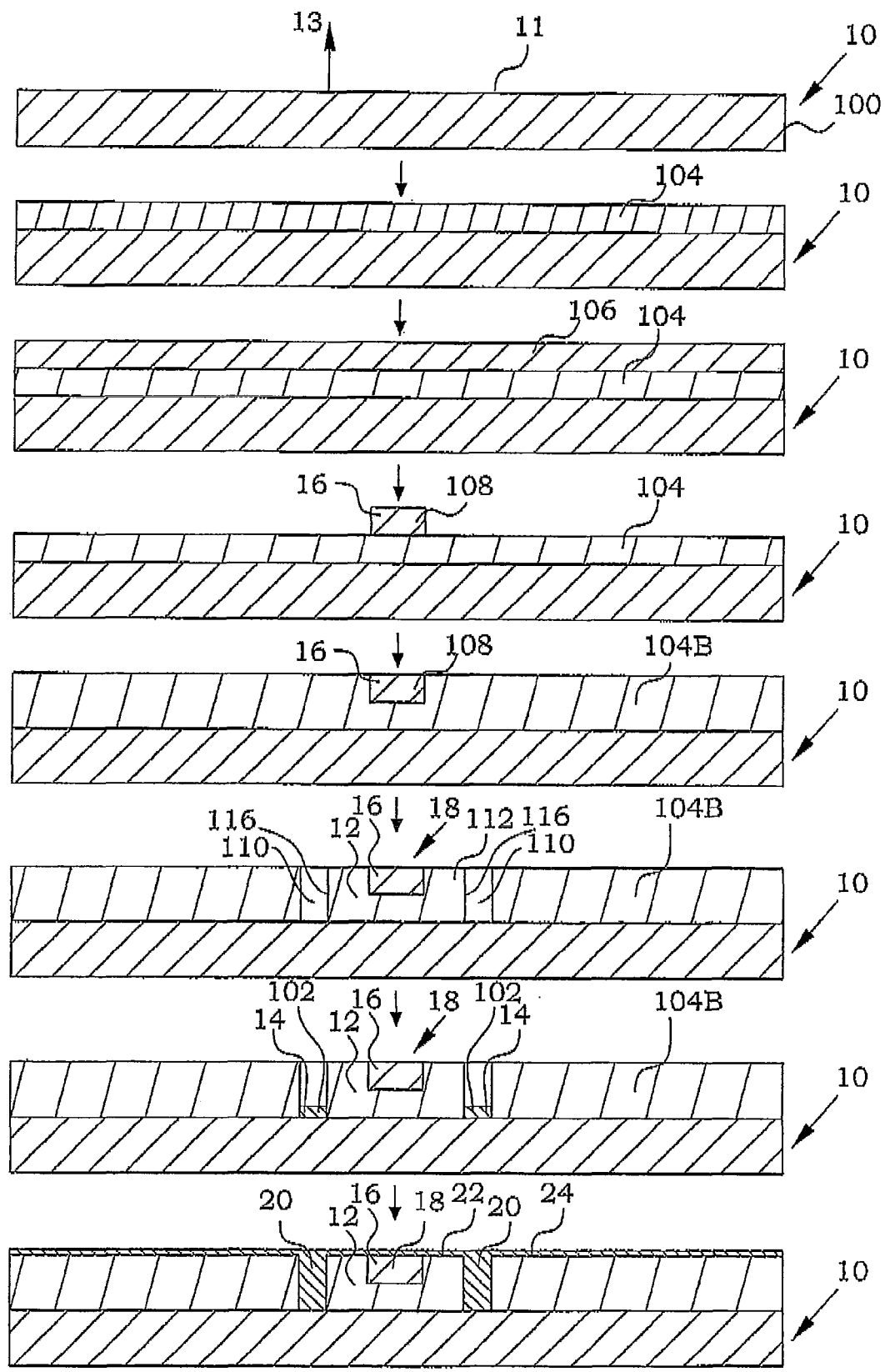
FIG. 5A is a schematic illustration of yet another specific embodiment of a manufacturing method according to the present invention.

In FIG. 5A, another embodiment of the present invention is illustrated schematically. Here, no seed layer is provided until the openings 110 through the waveguide cladding layer are etched down to the substrate 10. The seed layer is provided in the bottom of the openings 110. The growth of the opening fillings 20 and contact layer 22 follow earlier described operations.

An embodiment starting out from a SOI substrate can also be illustrated by FIG. 5A. In such a case, the process starts with a SOI substrate, e.g. the situation shown in the third part figure, where main substrate covered with an insulator—the lower waveguide cladding layer—and silicon—the waveguide core layer. The production of such a SOI substrate follows standard procedures well known for anyone skilled in the art and will not be discussed in detail. The rest of the embodiment of a method according to the present invention starting from the SOI substrate follows the steps indicated in FIG. 5A.

Figure 5B:
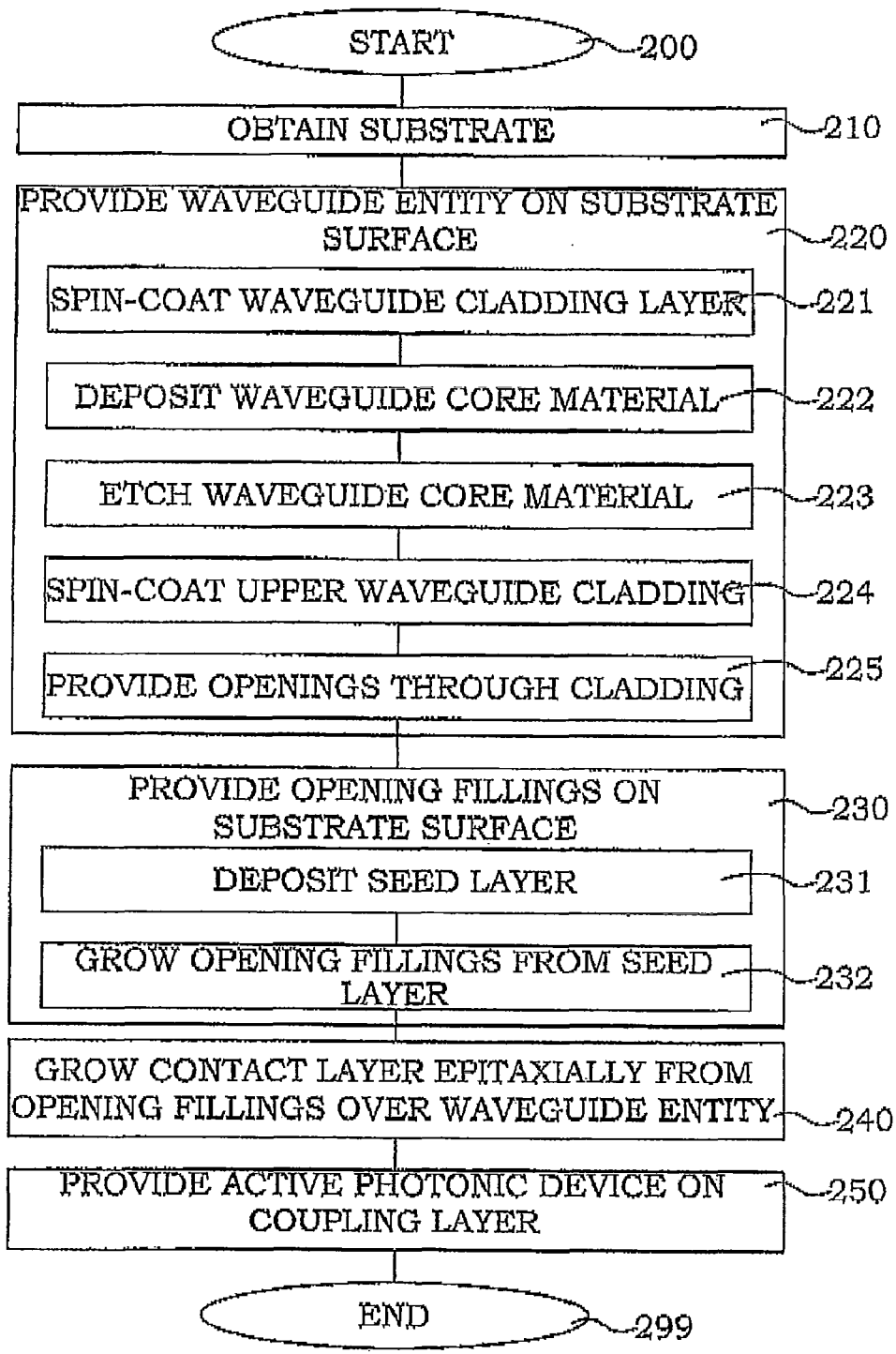
FIG. 5B is a flow diagram of steps of the embodiment of a manufacturing method according to FIG. 5A.

A corresponding flow diagram is illustrated in FIG. 5B, where the step 230 is performed entirely after step 220.

Figure 6A:
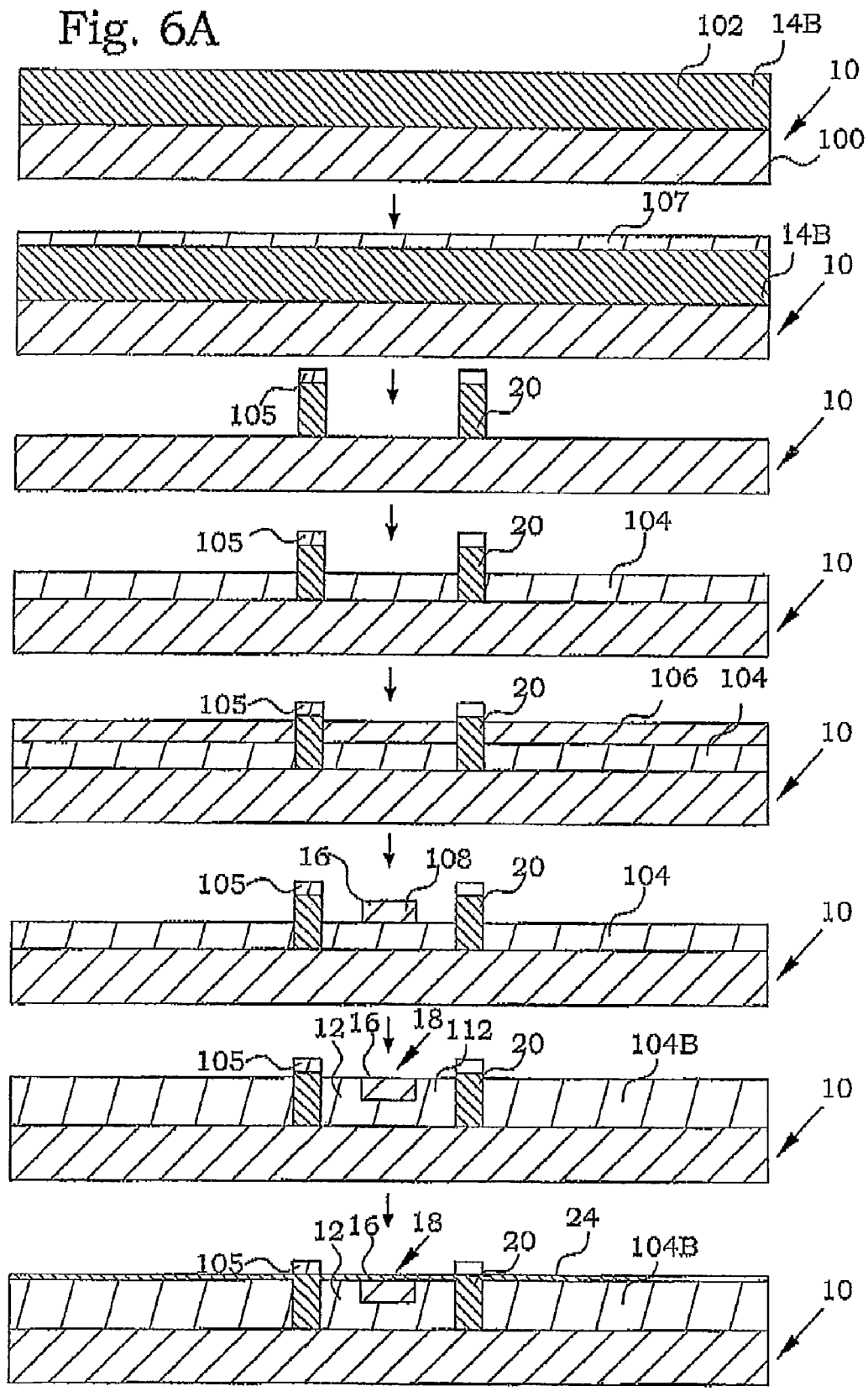
FIG. 6A is a schematic illustration of yet another specific embodiment of a manufacturing method according to the present invention.

In FIG. 6A, another embodiment of the present invention is illustrated schematically. Here, a seed layer 14B is provided on a Si substrate. A mask layer 107, in the present embodiment of $SiO_2$, is provided, in the present embodiment spin-coated, over the seed layer 14B. The mask layer 107 and the seed layer 14B are etched down to thin stripes, forming opening fillings 20 with a protective cover of $SiO_2$ 105. The waveguide entity 18 is formed according to similar principles as described before. The wave guide core layer 106 and the waveguide cladding layer 104B are controlled to a thickness that is slightly lower than the height of the opening fillings 20. There is here no need for any etching of the waveguide cladding layer 104B since the opening fillings 20 already are formed. A final contact layer 22 is grown epitaxially laterally from the opening fillings on top of the waveguide entity 18. After this step, the mask covering the opening fillings may be removed by etching.

Figure 6B:
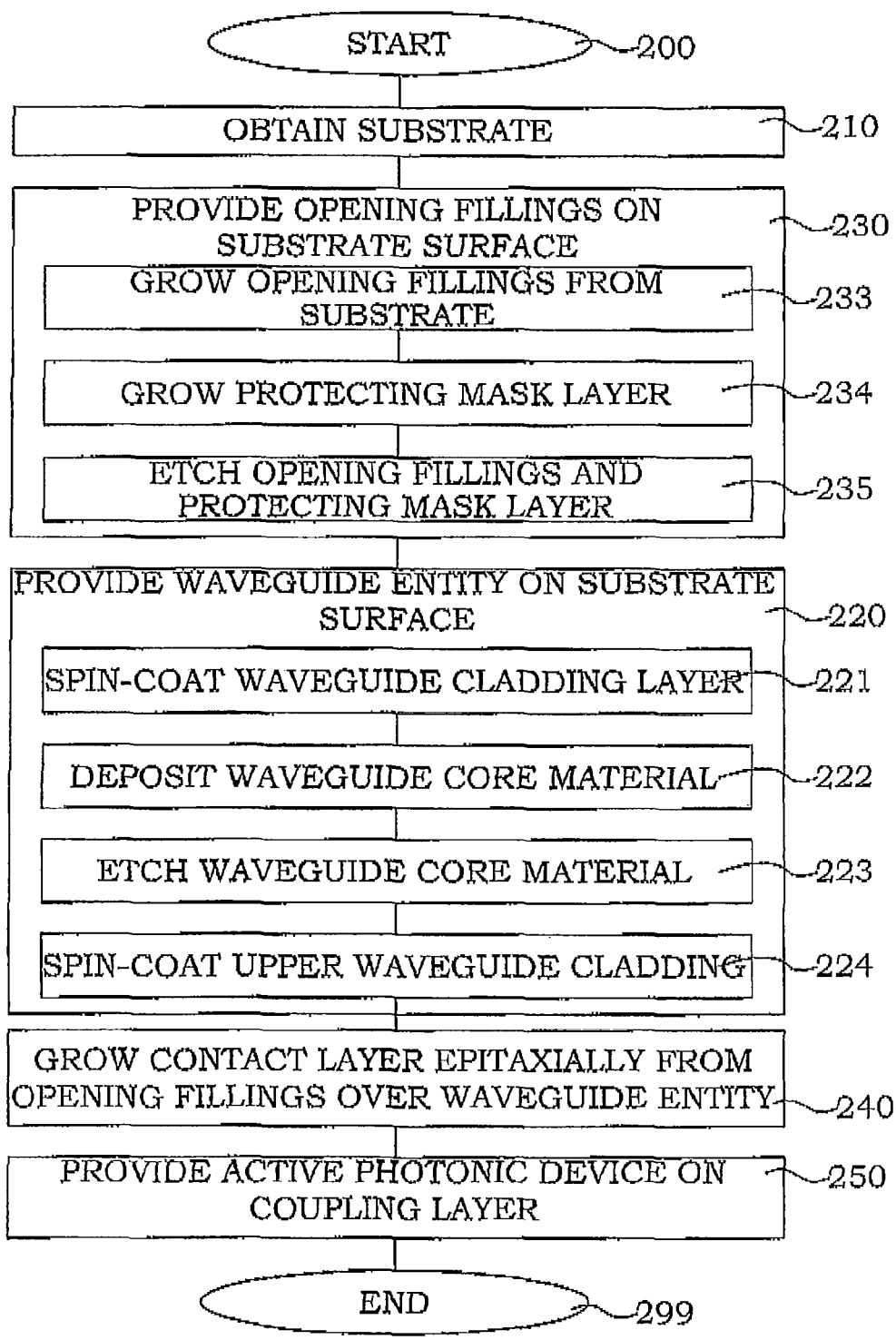
FIG. 6B is a flow diagram of steps of the embodiment of a manufacturing method according to FIG. 6A.

A corresponding flow diagram is illustrated in FIG. 6B. The step 230 is here performed entirely before step 220 and comprises three substeps. In step 233, opening fillings are epitaxially grown from the substrate surface. In step 234, a protecting mask layer is deposited on top of the opening filling layer. In step 235, the protecting mask layer and the opening filling layer are etched to form the final shape of the opening fillings. Step 220 is similar to what was described in FIG. 3B, however, without the etching step 225.

There are several conceivable embodiments that differ mainly in the layout of the waveguides and seed layer as well as the order in which these are realized. In all embodiments waveguides are realized on a substrate. Semiconductor material, e.g. III-V material, will be grown from the substrate in areas between the waveguides and then laterally over the waveguides so that it extends over the waveguide core. In particular in the case of a Si and SOI substrate as base, the opening width should preferably be equal to or less than the height of the waveguide entity, so that potential dislocations in the III-V seed layer will be blocked by the same waveguide entity. There may be any number of waveguides on the substrate and the area where there are no waveguides may be open or covered by mask.

Figure 7:
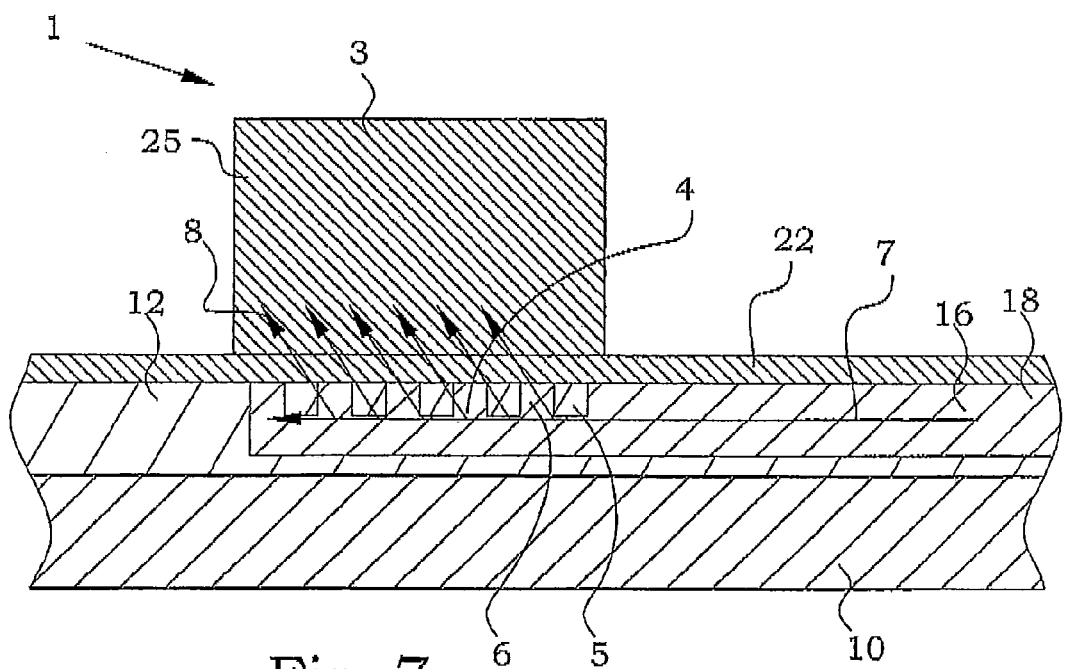
FIG. 7 is a schematic illustration of another embodiment of an active photonic device assembly according to the present invention.

The active photonic device may also be e.g. a detector. This may be coupled evanescently just like the previously mentioned laser, in which case the fabrication process up to the growing of the active layer is essentially identical. However, light may also be coupled from the underlying waveguide to the detector by means of e.g. a refractive grating in the waveguide. In such an embodiment, the requirements on thickness of the overgrown semiconductor layer, e.g. a III-V layer, is less stringent, since loss due to absorption of light in the same layer is very low. An embodiment of an active photonic device assembly 1 according to the present invention using refractive gratings is schematically illustrated in FIG. 7. The active photonic device assembly 1 is viewed in a direction perpendicular to what has been illustrated in earlier figures. The active photonic device 25 is in this embodiment a detector 3. The detector is provided on top of the contact layer 22, in turn being epitaxially grown on top of a waveguide entity 18 comprising a waveguide core 16 and a cladding 12. In the present embodiment, the waveguide entity 18 also comprises a grating 4. The grating 4 is formed by periodic indentations 5 in the waveguide core 16 defining periodic core portions 6. Light 7 entering the waveguide core 16 will be refracted 8 into the detector. In other words, the waveguide grating is arranged to couple light between the waveguide and the active photonic device.

In this embodiment, fabrication will comprise the defining of the waveguide core 16, followed by etching of the volumes of the periodic indentations 6, which will constitute the grating 4. Then, an $SiO_2$ layer will be deposited, e.g. by spin-coating, as cladding, which also fills the etched volumes. Thus a waveguide grating is created, which directs light between the waveguide entity and the active photonic device. Openings (not seen in the view of the figure) for the opening fillings will be etched, seed layer may be deposited and overgrowth of a contact layer 22 of e.g. a III-V semiconductor from the openings will be performed just as in the case of the earlier described fabrication of a laser device. The detector 3 active layer will then be grown on top of this contact layer 22 and metal contacts will finally be fabricated as previously outlined (not illustrated here).

The embodiments presented here above are only non-exclusive examples of how the present invention can be realized. Also other alternatives and modifications are possible.

The waveguide entity in the embodiments above has been based on the material combination silicon/silicon oxide. This material combination has certain advantages, but there are also other choices. For example, another useful waveguide entity can also be formed by the material combination silicon/silicon nitride.

The contact layer has in the embodiments above been assumed to be InP or at least a III-V semiconductor material. This is also the most investigated and in some aspects preferred material choice. However, there are also numerous alternatives which also may operate satisfactorily. In the most general application, any type of semiconductor material could be used, as long as it is compatible with the growth of an active photonic device on top of it. Most promising of such materials are compound semiconductor materials of any combination of elements from groups II, III, V and VI of the periodic table. III-V semiconductor materials are well established in such applications, mainly GaAs or InP. However, also germanium or II-VI semiconductor materials are of potential use.

As a substrate, a pure material or a combination of materials can be utilized. As a main volume of the substrate, silicon is one possible choice. Other choices could e.g. be an insulator, e.g. comprising silicon oxide and/or a metal oxide. Also other types of semiconductor materials can be used as a substrate. The substrate could even comprise the same semiconductor material as the semiconductor material in the contact layer, eliminating the need for a seed layer. The substrate can be provided as a pure material or combination of materials with additional layers deposited, e.g. Si covered with a seed layer of a III-V material or Si covered with nanowires of semiconductors from groups IV or III and V or II and VI of the periodic table.

In the embodiments presented above, most configurations are symmetric. However, this is not absolutely necessary for achieving the benefits of the invention and different asymmetric configurations will operate as well.

The embodiments disclosed here above are meant as pure non-exclusive examples on what kind of devices that may be integrated with $Si/SiO_2$ waveguides, but several other embodiments are also feasible, such as different kinds of lasers. Non-exclusive examples of such lasers are distributed feedback (DFB), distributed Bragg reflector (DBR) and ring/microdisk lasers as well as other kinds of detectors and modulators. The current invention includes the method by which coupling is achieved between the devices on III-V layer and the waveguides as well as integration of III-V devices. In this respect there is no greater conceptual difference between the mentioned alternative embodiments.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. An active photonic device assembly, comprising:
   a substrate, being one of a semiconductor substrate and an insulator substrate, said substrate having a substrate surface;
   a waveguide entity, including a waveguide core, provided in a first layer on said substrate surface;
   filling material at least filling at least one opening in said first layer,
      said filling material including a first semiconductor material; and
      said waveguide entity and at least part of said filling material being arranged adjacent to each-other in a direction parallel to said substrate surface;
   a contact layer comprising a material being lattice matched to
   said first semiconductor material grown epitaxially with respect to said filling material, from said filling material, in at least one direction parallel to said substrate surface on top of a surface of said waveguide entity facing away from said substrate surface; and
   an active photonic device provided on said contact layer.

2. The active photonic device assembly according to claim 1, wherein said waveguide entity comprises silicon.

3. The active photonic device assembly according to claim 1, wherein said contact layer being thinner than 1000 nm.

4. The active photonic device assembly according to claim 1, wherein said substrate comprises a seed layer, a surface of which is lattice matched to said first semiconductor material.

5. The active photonic device assembly according to claim 1, wherein said filling material further comprises a seed layer, a surface of which is lattice matched to said first semiconductor material, provided on said substrate surface adjacent to said waveguide entity.

6. The active photonic device assembly according to claim 1, wherein said substrate comprises one of silicon and silicon on insulator—SOI.

7. The active photonic device assembly according to claim 1, wherein said substrate comprises an insulator comprising one of silicon oxide and metal oxide.

8. The active photonic device assembly according to claim 1, wherein said first semiconductor material is a III-V material.

9. The active photonic device assembly according to claim 1, comprising more than one waveguide entity and wherein a spacing between adjacent ones of said more than one waveguide entity is smaller than a height of respective waveguide entities surrounding said spacing.

10. A method for manufacturing of an active photonic device assembly, comprising the steps of:
   obtaining a substrate, being one of a semiconductor substrate and an insulator substrate, said substrate having a substrate surface;
   providing a waveguide entity in a first layer on said substrate surface, said first layer having at least one opening;
   providing a filling material at least filling said at least one opening, where said filling material includes a first semiconductor material;
   said steps of providing a waveguide entity and providing filling material together arrange the waveguide entity and at least a part of the filling material adjacent to each other in a direction parallel to said substrate surface;
   growing a contact layer comprising a material being lattice matched to said first semiconductor material epitaxially with respect to said filling material, from said filling material, in at least one direction parallel to said substrate surface on top of a surface of said waveguide entity facing away from said substrate surface;
   and providing an active photonic device on said contact layer.

11. The method according to claim 10, wherein said step of providing a waveguide entity comprises providing of a waveguide entity comprising silicon.

12. The method according to claim 10, wherein said step of epitaxially growing a contact layer comprises epitaxially growing a contact layer being thinner than 1000 nm.

13. The method according to claim 10, wherein said step of providing an active photonic device is performed by epitaxially growing said active photonic device on said contact layer.

14. The method according to claim 10, wherein said step of obtaining a substrate comprises the step of providing a seed layer, a surface of which is lattice matched to said first semiconductor material, at a main substrate material.

15. The method according to claim 10, wherein said step of providing a filling material comprises providing a seed layer, a surface of which is lattice matched to said first semiconductor material, on said substrate surface adjacent to said waveguide entity.

16. The method according to claim 10, wherein said first semiconductor material is a III-V material.

17. The method according to claim 10, comprising the step of providing more than one waveguide entity with a spacing between adjacent ones of said more than one waveguide entity being less than a height of respective waveguide entity surrounding said spacing.

18. The active photonic assembly according to claim 1, wherein said active photonic device is grown epitaxially with respect to said contact layer.

19. The active photonic assembly according to claim 1, wherein said first layer comprises a waveguide cladding.

20. The active photonic assembly according to claim 1, wherein said contact layer comprises said first semiconductor material.

* * * * *